(12) United States Patent
Seddon et al.

(10) Patent No.: US 11,387,130 B2
(45) Date of Patent: Jul. 12, 2022

(54) SUBSTRATE ALIGNMENT SYSTEMS AND RELATED METHODS

(71) Applicant: SEMICONDUCTOR COMPONENTS INDUSTRIES, LLC, Phoenix, AZ (US)

(72) Inventors: Michael J. Seddon, Gilbert, AZ (US); Takashi Noma, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 18 days.

(21) Appl. No.: 16/505,949

(22) Filed: Jul. 9, 2019

(65) Prior Publication Data

US 2020/0243366 A1    Jul. 30, 2020

Related U.S. Application Data

(60) Provisional application No. 62/796,675, filed on Jan. 25, 2019.

(51) Int. Cl.
| | |
|---|---|
| *H01L 21/68* | (2006.01) |
| *H01L 21/768* | (2006.01) |
| *H01L 21/78* | (2006.01) |
| *H01L 23/544* | (2006.01) |

(52) U.S. Cl.
CPC ............ *H01L 21/681* (2013.01); *H01L 21/78* (2013.01); *H01L 23/544* (2013.01); *H01L 2223/54426* (2013.01)

(58) Field of Classification Search
CPC .................. H01L 21/78; H01L 23/544; H01L 2223/5446; H01L 2224/94; H01L 2223/54426; H01L 21/6836; H01L 2221/68327; H01L 2223/5442; H01L 2223/54453; H01L 2223/5448
See application file for complete search history.

(56) References Cited

U.S. PATENT DOCUMENTS

| | | | | |
|---|---|---|---|---|
| 6,309,943 | B1* | 10/2001 | Glenn | H01L 21/481 |
| | | | | 257/E23.179 |
| 9,728,509 | B1* | 8/2017 | Stamper | H01L 21/31056 |
| 2004/0211750 | A1* | 10/2004 | Palla | H01L 21/304 |
| | | | | 428/209 |
| 2004/0212047 | A1* | 10/2004 | Joshi | H01L 23/585 |
| | | | | 257/620 |
| 2005/0282360 | A1* | 12/2005 | Kida | H01L 23/544 |
| | | | | 438/462 |
| 2010/0120228 | A1* | 5/2010 | Saito | B23K 26/0604 |
| | | | | 438/463 |
| 2010/0255657 | A1* | 10/2010 | Priewasser | H01L 21/3043 |
| | | | | 438/462 |

(Continued)

*Primary Examiner* — Nicholas J Tobergte
*Assistant Examiner* — David J Goodwin
(74) *Attorney, Agent, or Firm* — Adam R. Stephenson, LTD.

(57) ABSTRACT

Implementations of a method of making a plurality of alignment marks on a wafer may include: providing a wafer including an alignment feature on a first side of the wafer. The method may include aligning the wafer using a camera focused on the first side of the wafer. The wafer may be aligned using the alignment feature on the first side of the die. The wafer may also include creating a plurality of alignment marks on a second side of the wafer through lasering, sawing, or scribing.

19 Claims, 1 Drawing Sheet

(56) References Cited

U.S. PATENT DOCUMENTS

2013/0267076 A1\* 10/2013 Lei ..................... B23K 26/364
                                                         438/460
2018/0345418 A1\* 12/2018 Lei ..................... B23K 26/364

\* cited by examiner

SUBSTRATE ALIGNMENT SYSTEMS AND RELATED METHODS

CROSS REFERENCE TO RELATED APPLICATIONS

This application claims the benefit of the filing date of U.S. Provisional Patent Application 62/796,675, entitled "SUBSTRATE ALIGNMENT SYSTEMS AND RELATED METHODS" to Seddon et al., which was filed on Jan. 25, 2019, the disclosure of which is hereby incorporated entirely herein by reference.

BACKGROUND

1. Technical Field

Aspects of this document relate generally to systems and methods used for singulating substrates. More specific implementations involve semiconductor substrates.

2. Background

Semiconductor substrates are used to form a wide variety of semiconductor devices. The semiconductor devices are generally distributed across a planar surface of the semiconductor substrate in a plurality of die. The plurality of die are separated from one another using a singulation process like sawing.

SUMMARY

Implementations of a method of making a plurality of alignment marks on a wafer may include: providing a wafer including an alignment feature on a first side of the wafer. The method may include aligning the wafer using a camera focused on the first side of the wafer. The wafer may be aligned using the alignment feature on the first side of the die. The wafer may also include creating a plurality of alignment marks on a second side of the wafer through lasering, sawing, or scribing.

Implementations of the method may include one, all, or any of the following:

The alignment mark may be created in a metal layer included on the second side of the wafer.

The metal layer may include a thickness of 10 microns before the alignment mark is created.

The metal layer may include a thickness of 1 micron in the alignment mark after grooving.

Scribing may further include using a scribe tool or a stylus.

The method may further include forming a groove in a thickness of a metal layer coupled to the second side of the wafer using one of lasering, sawing or scribing and singulating the wafer using one of lasering or sawing.

Grooving may include using a laser and singulating may include using a laser.

Grooving may include using a laser and singulating may include using a saw.

The camera may be one of an infrared camera or a visible light camera.

Implementations of a method of making a plurality of alignment marks on a wafer may include: providing a wafer having an alignment feature. The alignment feature may be in a die street in a first side of the wafer between a plurality of active areas on a first side of the wafer. A metal layer may be included on a second side of the wafer. The metal layer may have a first thickness. The method may include aligning the wafer using a camera and a plurality of alignment features and creating a plurality of alignment marks on a second side of the wafer through one of lasering, sawing, or scribing. The method may further include thinning the first thickness of the metal layer to a second thickness in the alignment mark.

Implementations of the method may include one, all, or any of the following:

Singulating the wafer into a plurality of die with one of a laser, a saw, or a cutting tool.

The metal layer may include copper.

Scribing may include using a scribe tool or a stylus.

The first thickness may be 10 microns before the alignment mark is created.

The second thickness may be 1 micron in the alignment mark after thinning.

The camera may be an infrared camera or a visible light camera.

Implementations of a method of making a plurality of alignment marks on a wafer may include: providing a wafer having a first side and a second side. The first side may include a plurality of die and one or more die streets between each of the plurality of die. The second side may include a metal layer having a first thickness. The method may include aligning the wafer using a plurality of alignment features in two or more of the die streets with the alignment camera. The method may include creating a plurality of alignment marks on a second side of the wafer through one of lasering, sawing, or scribing. The plurality of alignment marks may correspond with the one or more of the plurality of alignment features. The method may include grooving the one or more alignment marks with one of lasering, sawing or scribing; and singulating the plurality of die by cutting the wafer with one of lasering, sawing or scribing.

Implementations of the method may include one, all, or any of the following:

The metal layer may be copper.

The metal layer may include a second thickness of 1 micron in the groove.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended method of making a plurality of alignment marks on a substrate will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such a method of making a plurality of alignment marks on a substrate, and implementing components and methods, consistent with the intended operation and methods.

For semiconductor die that are less than 50 microns in thickness, particular processing challenges exist. Die handling, die strength, and performing processing operations with the die all present specific challenges, as die and wafer breakage can significantly reduce yield and/or affect device reliability. Die strength is negatively affected by traditional singulation options like sawing which induce die chipping and cracking along the die streets. These chips and cracks formed during the sawing process can eventually propagate during operation and reliability testing causing the die to fail.

Figure 1:
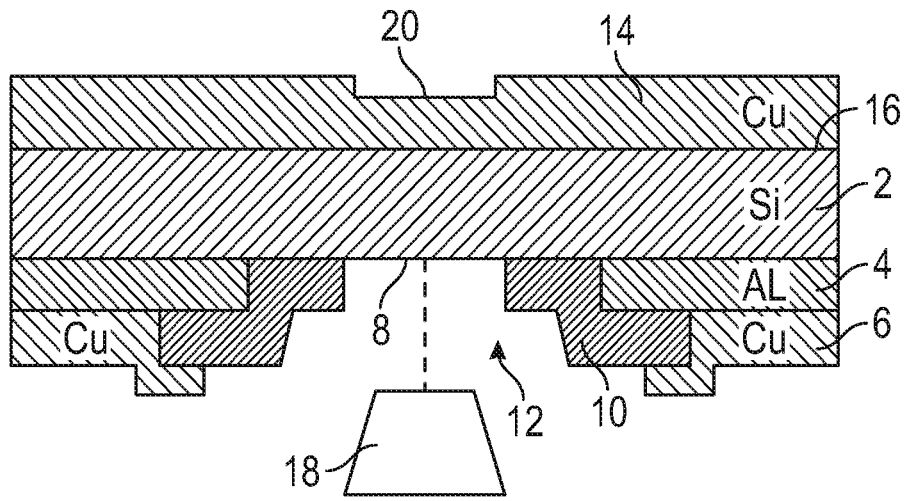
FIG. 1 is a cross sectional view of a substrate having an alignment mark in a metal layer.

Referring to FIG. 1, a cross sectional side view of a substrate 2 coupled to a plurality of layers is illustrated. The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "substrate" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate 2 may include a substrate material such as, by non-limiting example, single crystal silicon, silicon dioxide, glass, gallium arsenide, sapphire, ruby, silicon on insulator, silicon carbide, polycrystalline or amorphous forms of any of the foregoing, and any other substrate material useful for constructing semiconductor devices. In particular implementations, the substrate may be a silicon-on-insulator substrate.

In various implementations disclosed in this document, the semiconductor substrate 2 includes a plurality of semiconductor die that have been processed using a semiconductor fabrication process to form one or more semiconductor devices therein or thereon (not shown). This may include forming a plurality of layers on a first side 8 the substrate 2. The plurality of layers may be patterned, and in various implementations, may be patterned (or otherwise removed) to not be over a die street 12 in the substrate 2. The plurality of layers may include, by non-limiting example, one or more metal layers 4 and 6, one or more passivation layers 10, any other layer, and any combination thereof. In various implementations, the plurality of die may include power semiconductor devices, such as, by non-limiting example, a MOSFET, an IGBT, or any other power semiconductor device. In other implementations, the plurality of die may include non-power semiconductor devices.

In FIG. 1, the die are illustrated on either side of the die street 12. In various implementations, the die include aluminum, copper, and other electrically conductive materials. Following the completion of the fabrication process (or during some portion of it, in some implementations), the semiconductor substrate 2 is thinned on a side of the semiconductor substrate 2 that is opposite the side on which the one or more semiconductor devices have been formed to a desired substrate thickness. The thinning process takes place using backgrinding, lapping, etching, any combination thereof, or any other technique for removing the material of the semiconductor substrate 2 substantially uniformly across the largest planar surface of the substrate.

In various implementations, the substrate 2 may be thinned to a thickness less than 50 microns (μm). In other implementations, the substrate 2 may be thinned to a thickness less than 30 μm. In still other implementations, the substrate 2 may be thinned to a thickness less than 100 μm, more than 100 μm, and in other various implementations, the substrate 2 may not be thinned. In particular implementations, the substrate 2 may be thinned to a thickness of 25 μm, and in other particular implementations, the substrate may be thinned to a thickness of 75 μm. The substrate 2 may be thinned through backgrinding, etching, or any other thinning technique.

In various implementations, the thinning process may create an edge ring around the wafer (like that present in the backgrinding process marketed under the tradename TAIKO by Disco Hi-Tec America, Inc. of Santa Clara, Calif.). The edge ring acts to structurally support the wafer following thinning so that no wafer carrier may need to be utilized during subsequent processing steps. In various implementations, the thinning process may be carried out after the semiconductor substrate 2 has been mounted to a backgrinding tape whether an edge ring is formed during backgrinding or not. A wide variety of backgrinding tapes may be employed in various implementations, including those that are compatible with subsequent plasma etching operations.

In various implementations, following the thinning process, a back metal layer 14 is applied to the semiconductor die through, by non-limiting example, sputtering, evaporation, or another metal deposition process. In particular implementations, the backside metal layer 14 may be copper or a copper alloy. In other implementations, the backside metal layer may include any other type of metal, metal alloy, or combination thereof. In various implementations, the backside metal layer may be about 10 μm thick. In other implementations, the backside metal layer may be more or less thick than 10 μm. The backside metal layer 14 may be evaporated onto the substrate 2, however, in other implementations (including implementations having thicker substrates), the backside metal layer 14 may be electroplated or electrolessly plated onto the substrate 2 or formed on the substrate using another technique.

In various implementations, the deposition process is conducted while the wafer is either supported by an edge ring or supported by the backgrinding tape. In other implementations, however, the substrate may be demounted from the backgrinding tape and mounted to another support tape for subsequent processing steps. The method of forming and singulating a plurality of die may include flipping the substrate and, though not illustrated, in various implementations, the method may include applying a tape to a first side of the plurality of layers.

FIG. 1 illustrates an implementation of a semiconductor substrate 2 following the back metal deposition process and the thinning process. In various implementations, as illustrated, the substrate 2 is coupled with a tape 14 (which may be the backgrinding or other support tape in various implementations). In other implementations, however, at this stage in the process the wafer may not be coupled with a tape 14 (such as when an edge ring is being used). As illustrated, the one or more semiconductor die 4 (not yet separately visible) are covered by a layer of passivation material 10. In various implementations, the passivation material 10 may include, by non-limiting example, silicon nitride, silicon dioxide, polyimides, metal pads, underbump metallization (UBM), any combination thereof, and any other layer or material capable of facilitating electrical or thermal connection between the one or more semiconductor die and/or protecting the one or more semiconductor die from contaminants. In various implementations, thickness of the back metal may vary from between about 1 micron to about 15 microns. In particular implementations, the thickness of the back metal may be between about 1 micron to about 3 microns. In some implementations, the total thickness of the semiconductor substrate 2 may be less than about 50 microns. In particular implementations, the total thickness of the semiconductor substrate may be between about 25 microns to about 35 microns. In various implementations, the total thickness may be about 25 microns.

Following the thinning process, the various die formed in the semiconductor substrate 2 need to be singulated from one another so they can be subsequently packaged into semiconductor packages. Traditional singulation methods include singulating die from a front side of a substrate. In such methods, alignment hardware such as lenses and motors is required to be positioned under a vacuum chuck. The vacuum chuck is required to hold the wafer in place during the singulation process giving the alignment microscope/camera limited range across the wafer. However, the microscope/camera is unable to see through the vacuum chuck. In some traditional methods, the wafer is mounted to tape, which is also difficult for the camera to see through.

Referring to FIG. 1, a silicon wafer 2 before singulation is illustrated. In this particular implementation, the wafer includes aluminum 4 and copper 6 on a first side 8 of the wafer. A passivation layer 10 is formed around a die street 12 on the substrate 2. The die street 12 may act as an alignment feature. In various implementations, alignment features may also be included within the die street or on the edge(s) of active or inactive die areas formed on the substrate. In some implementations, two or more alignment features are used to align the substrate. The wafer 2 includes copper 14 on a second side 16 of the wafer 2 (which may be electroplated copper in various implementations). The copper plating may have a thickness of about 10 microns. In various implementations, copper may not be used, but a metal plating which may be gold, silver, nickel, and other materials used for back metallization of wafers and substrates.

Figure 2:
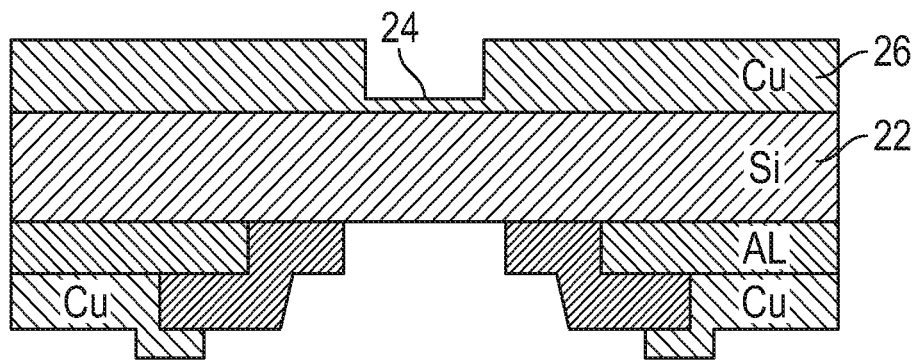
FIG. 2 is a cross sectional view of a substrate having a groove in a metal layer.
Figure 3:
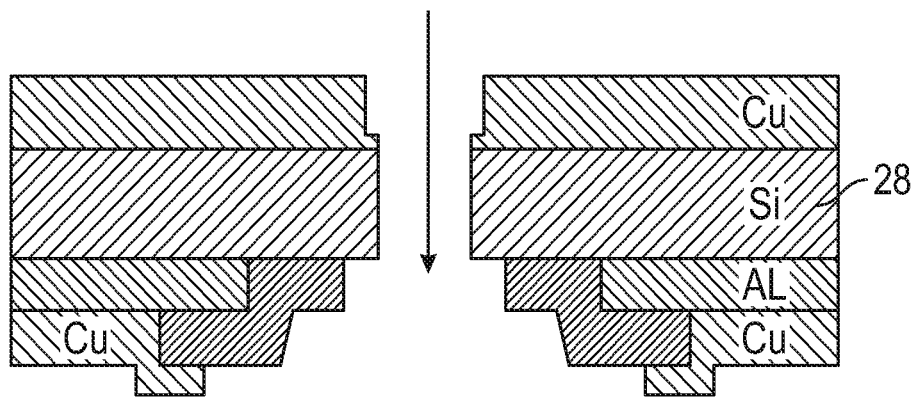
FIG. 3 is a cross sectional view of a singulated substrate.

An implementation of a method of forming a plurality of alignment marks on a wafer is illustrated in FIGS. 1-3. Referring to FIG. 1, a wafer is shown pre-singulation. In various implementations, the wafer may be mounted to a chuck, tape, or another structure to support the wafer (or an edge ring may be used as support). The method includes providing a wafer 2 having an alignment feature 12 on the first side 8 of the wafer. The method also includes aligning the wafer 2 using a camera/microscope 18 focused on the first side of the wafer 8 using the alignment feature 12. In various implementations, the alignment feature may include a die street, a portion of a die street, or another alignment feature in an active or inactive die area of the substrate. In other implementations, the alignment features may be visible within the die street. The alignment features within the die street may be, by non-limiting example, on a first outer surface of the substrate. In some implementations, the alignment features may be located within any layer of the substrate. In still other implementations, the alignment features may be located on an edge or corner of a die. The camera used to align the substrate may be an infrared camera or a visible light camera. In some implementations, a microscope may be used in point locations to align the wafer and to make alignment marks which will be described in more detail below.

The method also includes creating a plurality of alignment marks 20 on a second side 16 of the wafer 2. The alignment marks 20 may be formed through lasering, sawing, or scribing. In various implementations, scribing of the marks may include using a scribe tool or a stylus. As illustrated, the alignment mark 20 is created/formed in the copper layer 14 on the second side of the wafer. In various implementations, a different metal or metal alloy like any disclosed herein may be used as the metal layer. In other implementations, another layer of material may be formed on the second side of the wafer. As previously described, the metal layer may have a thickness of about 10 microns before the alignment mark is created. Creating alignment marks on the second side of the wafer in the metal backing may allow the substrate to remain aligned or be realigned for subsequent processing a standard camera facing the second side of the wafer/substrate 2.

Referring to FIG. 2, a wafer/substrate 22 having a groove 24 in a metal layer 26 is illustrated. The method for making a plurality of alignment marks on a wafer 22 also includes forming a groove 24 in a thickness of the metal layer 26. The groove may be formed through lasering, sawing, or scribing. Scribing may include using a scribe tool or a stylus. The metal layer 26 may have a thickness of about 1 micron in the alignment mark 24 after grooving. The thickness, however, may be less than 1 micron or more than 1 micron in various implementations. Singulating the wafer 28 is illustrated in FIG. 3. The wafer may be singulated with a lower risk of re-deposition because the backmetal thickness has been reduced. In various implementations, the back metal having a thickness of about 10 microns may be reduced to about 1 micron or less.

Singulating may be done through plasma cutting, lasering, or sawing. In various implementations, singulation of the dies may be performed from a first side of the wafer or a second side of the wafer. In some implementations, the grooving and singulating of the wafer may be performed with the same tool. By non-limiting example, grooving and singulating may be done using a laser. In other implementations, grooving and singulating may be done using different methods. For example, grooving may be done through lasering while singulating may be done using a saw. In another example, grooving may be done with a saw and singulating may be done through lasering. Where plasma etching is employed, the etching may take place from the first side of the wafer, in various implementations. In various implementations, the method described can be used with or without tape on the first side of the substrate. The method may further include remote plasma healing after singulation to remove any sidewall damage. Remote plasma healing may also be performed to remove any re-deposition that may have occurred.

In places where the description above refers to particular implementations of methods for making a plurality of alignment marks on a wafer and implementing components, sub-components, methods and sub-methods, it should be readily apparent that a number of modifications may be made without departing from the spirit thereof and that these implementations, implementing components, sub-components, methods and sub-methods may be applied to other methods for making a plurality of alignment marks on a wafer.

What is claimed is:

1. A method for making a plurality of alignment marks on a wafer, the method comprising:

providing a wafer comprising an alignment feature on a first side of the wafer the wafer comprising a thickness of 50 microns or less and a metal layer comprised on a second side of the wafer, the metal layer comprising a thickness of 10 microns or less;

aligning the wafer using an alignment tool focused on the first side of the wafer using the alignment feature; and creating a plurality of alignment marks in the metal layer through one of lasering, sawing, or scribing;

wherein the plurality of alignment marks extend only partially into the thickness of the metal layer.

2. The method of claim 1, wherein scribing further comprises using a scribe tool or a stylus.

3. The method of claim 1, further comprising:

forming a groove in the thickness of the metal layer coupled to the second side of the wafer using one of lasering, sawing or scribing; and singulating the wafer using one of lasering or sawing.

4. The method of claim 3, wherein the metal layer comprises a thickness of 1 micron in the plurality of alignment marks after grooving.

5. The method of claim 3, wherein grooving comprises using a laser and singulating comprises using the laser.

6. The method of claim 3, wherein grooving comprises using a laser and singulating comprises using a saw.

7. The method of claim 3, wherein the groove is formed only partially through the thickness of the metal layer.

8. The method of claim 1, wherein the alignment tool is one of an infrared camera or a visible light camera.

9. A method for making a plurality of alignment marks on a wafer, the method comprising:

providing a wafer comprising an alignment feature, the alignment feature in a die street on a first side of the wafer between a plurality of active areas on a first side of the wafer and a metal layer on a second side of the wafer, the metal layer having a first thickness of 10 microns or less;

aligning the wafer using a camera and a plurality of alignment features;

creating a plurality of alignment marks in the metal layer through one of lasering, sawing, or scribing; and thinning the first thickness of the metal layer to a second thickness in the alignment mark;

wherein a thickness of the wafer is 50 microns or less.

10. The method of claim 9, singulating the wafer into a plurality of die with one of a laser, a saw, or a cutting tool.

11. The method of claim 9, wherein the metal layer comprises copper.

12. The method of claim 9, wherein scribing further comprises using a scribe tool or a stylus.

13. The method of claim 12, wherein the second thickness is 1 micron in the plurality of alignment marks after thinning.

14. The method of claim 9, wherein the camera is an infrared camera or a visible light camera.

15. A method for making a plurality of alignment marks on a wafer, the method comprising:

providing a wafer comprising a first side and a second side, wherein the first side comprises a plurality of die and one or more die streets between each of the plurality of die and the second side comprises a metal layer having a thickness of 10 microns or less;

aligning the wafer using a plurality of alignment features in two or more of the one or more die streets with an alignment camera;

creating one or more alignment marks in the metal layer through lasering, sawing, or scribing, wherein the one or more alignment marks correspond with the one or more of the plurality of alignment features;

grooving the one or more alignment marks with one of lasering, sawing or scribing; and singulating the plurality of die by cutting the wafer with one of lasering, sawing or scribing;

wherein a thickness of the wafer is 50 microns or less.

16. The method of claim 15, wherein the metal layer is copper.

17. The method of claim 15, wherein the metal layer comprises a second thickness of 1 micron in a groove.

18. The method of claim 15, wherein scribing further comprises one of using a scribe tool or a stylus.

19. The method of claim 15, wherein the one or more alignment marks extend only partially into the thickness of the metal layer.

* * * * *